United States Patent
Chang et al.

(10) Patent No.: US 11,296,720 B2
(45) Date of Patent: Apr. 5, 2022

(54) DATA COMPRESSION USING REDUCED NUMBERS OF OCCURRENCES

(71) Applicant: Innogrit Technologies Co., Ltd., Shanghai (CN)

(72) Inventors: Yuan-Mao Chang, Hsinchu (TW); Fang-Ju Ku, Zhubei (TW)

(73) Assignee: Innogrit Technologies Co., Ltd., Shanghai (CN)

( * ) Notice: Subject to any disclaimer, the term of this patent is extended or adjusted under 35 U.S.C. 154(b) by 0 days.

(21) Appl. No.: 17/000,666

(22) Filed: Aug. 24, 2020

(65) Prior Publication Data
US 2022/0060196 A1 Feb. 24, 2022

(51) Int. Cl.
*H03M 7/00* (2006.01)
*H03M 7/30* (2006.01)
*H04L 69/04* (2022.01)

(52) U.S. Cl.
CPC .......... *H03M 7/6058* (2013.01); *H04L 69/04* (2013.01)

(58) Field of Classification Search
CPC ........ H03M 7/6058; H03M 7/00; H04L 69/04
USPC .................................................... 341/50, 51
See application file for complete search history.

(56) References Cited

U.S. PATENT DOCUMENTS

| | | | | |
|---|---|---|---|---|
| 7,518,538 | B1* | 4/2009 | Schneider | H03M 7/30 341/108 |
| 7,605,721 | B2* | 10/2009 | Schneider | H03M 7/4006 341/50 |
| 9,716,734 | B2* | 7/2017 | Bhaskar | H03M 7/30 |
| 11,115,049 | B1* | 9/2021 | Chang | H03M 7/6005 |
| 2009/0140894 | A1* | 6/2009 | Schneider | H03M 7/4006 341/51 |
| 2014/0279776 | A1* | 9/2014 | Brown | G06F 15/7867 706/20 |
| 2016/0371215 | A1* | 12/2016 | Brown | G06F 13/4027 |

OTHER PUBLICATIONS

Asymmetric numeral systems, Jarek Duda, arXiv:0902.0271v5 [cs.IT], May 21, 2009.
Asymmetric numeral systems: entropy coding combining speed of Huffman coding with compression rate of arithmetic coding, Jarek Duda, arXiv:1311 2540v2 [cs.IT], Jan. 6, 2014.

* cited by examiner

Primary Examiner — Jean B Jeanglaude
(74) Attorney, Agent, or Firm — IPRO, PLLC; Xiaomin Huang

(57) ABSTRACT

Systems, apparatus and methods are provided for compressing data. A method may include receiving an input data block to be compressed, determining numbers of occurrences for distinct symbols in the input data block, generating reduced numbers of occurrences for the distinct symbols based on the numbers of occurrences for the distinct symbols and encoding the input data block using the reduced numbers of occurrences as probability distribution of the distinct symbols in the input data block.

20 Claims, 5 Drawing Sheets

FIG. 2C

DATA COMPRESSION USING REDUCED NUMBERS OF OCCURRENCES

TECHNICAL FIELD

The disclosure herein relates to data compression, particularly relates to lossless compression using entropy encoding.

BACKGROUND

Data compression has been widely used in digital signal systems, such as communication and computing systems. In information theory, Claude Shannon's source coding theorem (or noiseless coding theorem) establishes the limits to possible data compression, and the operational meaning of the Shannon entropy. According to Shannon's source coding theorem, the optimal code length for a symbol is $-\log_b P$, where b is the number of symbols used to make output codes and P is the probability of the input symbol. Two of the most common entropy encoding techniques are Huffman coding and Arithmetic coding. Since 2014, data compressors have started using the Asymmetric Numeral Systems (ANS) family of entropy coding techniques, which allows combination of the compression ratio of Arithmetic coding and a processing cost similar to Huffman coding. These existing ANS implementations, however, are developed for a general-purpose computing system that normally uses a general-purpose Central Processing Unit (CPU) to perform the data compression or decompression operations. Therefore, there is a need for a compression technique that is more hardware friendly, for example, suitable for a Field Programmable Gate Array (FPGA) or an application specific integrated circuit (ASIC).

SUMMARY

The present disclosure provides systems and methods for a lossless compression using entropy encoding. In an exemplary embodiment, there is provided a method that may comprise receiving an input data block to be compressed, determining numbers of occurrences for distinct symbols in the input data block, generating reduced numbers of occurrences for the distinct symbols based on the numbers of occurrences for the distinct symbols and encoding the input data block using the reduced numbers of occurrences as probability distribution of the distinct symbols in the input data block.

In another exemplary embodiment, there is provided a compressor that may comprise: an input interface configured to receive an input data block to be compressed, an input buffer coupled to the input interface to store the received input data block to be compressed, a calculator coupled to the input interface and configured to determine numbers of occurrences for distinct symbols in the input data block and generate reduced numbers of occurrences for the distinct symbols based on the numbers of occurrences for the distinct symbols, and an encoder engine configured to encode the input data block using the reduced numbers of occurrences as probability distribution of the distinct symbols in the input data block.

BRIEF DESCRIPTION OF FIGURES

FIG. 2C schematically shows intervals for the states and symbol state intervals in accordance with an embodiment of the present disclosure.

DETAILED DESCRIPTION

Figure 1:
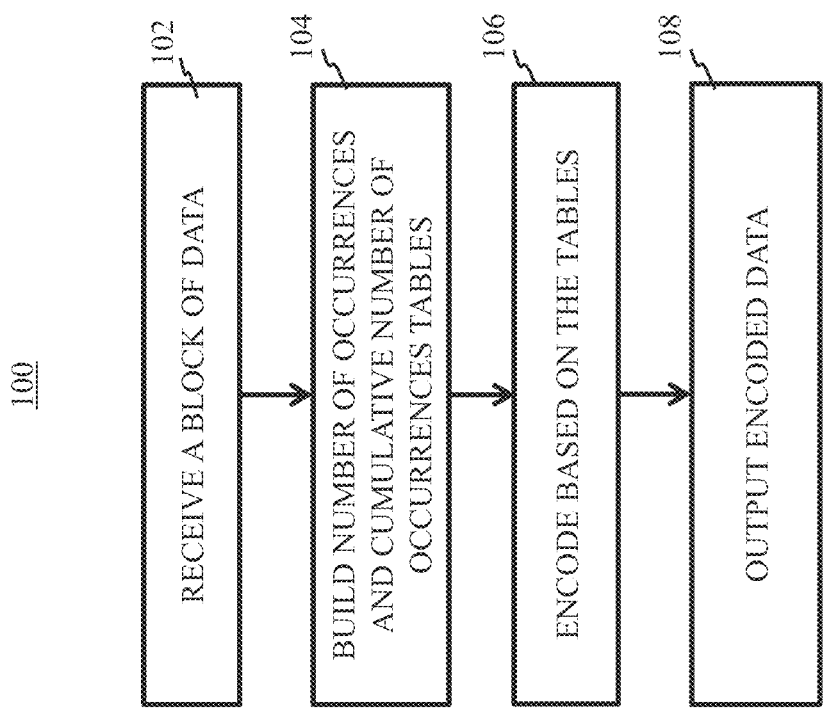
FIG. 1 schematically shows a compression process in accordance with an embodiment of the present disclosure.

Specific embodiments according to the present disclosure will now be described in detail with reference to the accompanying figures. Like elements in the various figures are denoted by like reference numerals for consistency.

FIG. 1 schematically shows a compression process 100 in accordance with an embodiment of the present disclosure. At block 102, a block of input data may be received. In one embodiment, a storage system controller (e.g. SSD controller) may receive a stream of data to be stored in the storage system. In another embodiment, a signal transmitter may receive a stream of data to be transmitted. The stream of data may be compressed using entropy encoding to reduce space used for storage or bandwidth used for transmission. Accordingly, the compression process 100 may also be referred to an encoding process. In some embodiments, the stream of data may be divided into blocks of data and each block of data may be encoded separately. Exemplary sizes of blocks may be 1 KB, 2 KB, 4 KB, etc. For example, one embodiment of compressor may be configured to encode blocks of size of 4 KB and a file with a size larger than 4 KB may be divided into several 4 KB blocks and any leftover in a remainder block smaller than 4 KB. And the blocks of data may be encoded separately.

At block 104, tables used for encoding may be built. In various embodiments, data in the input data block may be represented or organized in distinct data units, for example, 4-bit, 8-bit, 16-bit, etc. The data units may be power of 2 bits in some embodiments, but may not be power of 2 bits in some other embodiments. For example, in one embodiment, data in the input data block may be represented by American Standard Code for Information Interchange (ASCII) code, which is 7-bit. One data unit may be referred to as a symbol and thus the input data block may comprise many symbols. The total number of all symbols in an input data block may be represented as $S_{total}$, which may be 1024, 2048, or 4096 or another number in single digit, double digits, hundreds, thousands or larger. $S_{total}$ may vary for different input streams. Sometimes $S_{total}$ may be a fixed certain number, for example, a number that is power of 2. Some other times $S_{total}$ may not be a fixed certain number and not necessarily power of 2.

In general, a block of data may be formed by a set of distinct symbols with each symbol occurring once or multiple times. In some embodiments, a probability distribution of the symbols may be calculated for the block of input data and two tables may be built to represent the probability distribution of the symbols, a number of occurrences table and a cumulative number of occurrences table.

In one embodiment, the input data may be scanned to build the set of distinct symbols, and also to count the number of distinct symbols and how many times each distinct symbol occurs in the block of input data. In various embodiments, a symbol may have a predefined size, for example, one byte, two bytes, 4 bytes, etc. The size is not necessarily a power of two. As used herein, the set of distinct symbols may also be referred to as an alphabet (A), each symbol may also be referred to as an element and represented using the lower-case letter "s." The lower-case letter "n" may be used to represent the number of distinct symbols (or elements) in the alphabet with n being an integer larger than one. It should be noted that in some embodiments, the set of distinct symbols may be predetermined, for example, pre-programmed or given by a specification. In such embodiments, the input data may be scanned to just count the number of distinct symbols and how many times each distinct symbol occurs in the block of input data.

The number of occurrences for an element "s" may be denoted using the italicized lower-case letter "l" and subscript "s" as "$l_s$," and the total occurrences of all symbols in the block may be represented as "L" (with $$L = \sum_{i=0}^{n-1} l_i \Bigg).$$

The probability of occurrence for one element may be calculated by dividing a number of occurrences for the element by the total occurrences of all symbols in the block. That is, the probability of element "s" in the block of symbols is $l_s/L$. The number of occurrences for an element representing an actual number of occurrences for the element may be referred to as "$l_{s\text{-}actual}$" and may be obtained, for example, by counting how many times the element occurs in the block of input data. The total occurrences of all symbols in the block obtained by summing the actual numbers of occurrences for all distinct symbols may be referred to as the actual total occurrences of all symbols, or "$L_{actual}$". The probability of element "s" in the block of symbols $l_{s\text{-}actual}/L_{actual}$ may be referred to as an actual probability. It should be noted that the number $L_{actual}$ is equal to $S_{total}$.

In various embodiments, the actual symbol probability distribution may be processed to reduce the number of total occurrences of all symbols. The process may be referred to as a L reduction process or simply reduction. For example, after obtaining (e.g., by counting) the number of occurrences "$l_{s\text{-}actual}$" for an element, this actual number of occurrences may be reduced to generate a reduced number of occurrences "$l_{s\text{-}reduced}$" by dividing "$l_{s\text{-}actual}$" with a predetermined number DIV and round the division result to a non-zero whole number. In some embodiments, the set of distinct symbols may comprise only elements that appear in the input block of data to be compressed. That is, "$l_{s\text{-}actual}$" is not zero for each element in the alphabet. In some other embodiments, the alphabet may be a predetermined set of symbols, for example, ASCII or extended ASCII, and in at least one of such embodiments, not every element is necessarily in the input block of data. In such an embodiment, if "$l_{s\text{-}actual}$" may be zero for an element in the alphabet and the reduced number of occurrences "$l_{s\text{-}reduced}$" for this element may also be zero. Therefore, in all embodiments, non-zero whole number may be obtained when the corresponding "$l_{s\text{-}actual}$" is not zero.

There may be different approaches to obtain the non-zero whole number. In one embodiment, the non-zero whole number may be obtained by rounding up the division result to the nearest whole number using a ceiling function, for example, ceiling($l_{s\text{-}actual}$/DIV). In another embodiment, the non-zero whole number may be obtained by rounding down the division result to the nearest whole number using a floor function, for example, floor($l_{s\text{-}actual}$/DIV), and if the result of the floor function is zero, the non-zero whole number may be set as one. That is, the non-zero whole number may be floor($l_{s\text{-}actual}$/DIV)+1 if $l_{s\text{-}actual}$ is less than DIV. In yet another embodiment, the non-zero whole number may be obtained by rounding the division result to the closest whole number (e.g., rounding up if the reminder is equal to or greater than 0.5 and rounding down if the reminder is less than 0.5), and if the result by rounding is zero, set the result to one.

The predetermined number DIV may be any number larger than one and a typical example number may be a positive integer such as, but not limited to, 2, 3, or 4, etc. The same predetermined number may be used to reduce the number of occurrences for each distinct symbol in the input block of data. After the reduction in each individual number of occurrences for each distinct symbol, the number of total occurrences of all symbols may also be reduced to a reduced number of total occurrences of all symbols, which may be represented as "$L_{reduced}$." It should be noted that $L_{reduced}$ may be close to $L_{actual}$/DIV but not necessarily equal.

As an example, suppose a symbol "α" appeared five (5) times in a block of 4096 symbols and a symbol "β" appeared three (3) times in the same block. There may be other symbols in the same block with a total number of occurrences of 4088 (4096−8). The symbol "α" may have an actual number of occurrences of 5 and actual probability of occurrences of 5/4096. The symbol "β" may have an actual number of occurrences of 3 and actual probability of occurrences of 3/4096. In an embodiment, the ceiling function may be used to obtain the reduced number of occurrences, with an example DIV being 4, for symbol "α" the "$l_{s\text{-}reduced}$" may be obtained by ceiling($l_{s\text{-}actual}$/DIV), which is equal to two (2) and for symbol "β" the "$l_{s\text{-}reduced}$" may be obtained by ceiling($l_{s\text{-}actual}$/DIV), which is equal to one (1). In another embodiment, the floor function may be used to obtain the reduced number of occurrences, still with an example DIV being 4, for symbol "α" the "$l_{s\text{-}reduced}$" may be obtained by floor ($l_{s\text{-}actual}$/DIV), which is equal to one (1); and for symbol "β", because $l_{s\text{-}actual}$ is less than DIV, the "$l_{s\text{-}reduced}$" may be obtained by floor($l_{s\text{-}actual}$/DIV)+1, which is also equal to one (1). In both cases, after L reduction, the reduced total number of occurrences for all symbols may be $$L_{reduced} = \sum_{i=0}^{n-1} l_{i-reduced},$$

which may be equal to 1024 (4096/4), or close to 1024 but not equal to 1024 (e.g., larger or smaller than 1024).

In various embodiments, the probability distribution used for compression or decompression may be the actual probability distribution or a probability distribution after a L reduction and the compression is lossless in both cases. It should be noted that an embodiment may obtain the best compression ratio with the actual probability distribution. Using a probability distribution after a L reduction may improve speed and reduce hardware cost (e.g., storage space) but may sacrifice a little on compression ratio. Because the compression and decompression techniques according to the present disclosure may be implemented using either actual probability distribution or a probability distribution after a L reduction, the term "$l_s$" may be used as a generic term for number of occurrences for an element "s", which may be the actual number of occurrences for an element "s" or a reduced number of occurrences for the element "s". And, the term "L" may be used as a generic term for the number of total occurrences of all symbols in a block of data, which may be the actual number of total occurrences of all symbols in a block of data or a reduced number of total occurrences of all symbols in a block of data.

An example with L being 8 and an alphabet having three elements may be used to illustrate the compression and decompression operations according to an embodiment. The three elements alphabet may be represented as {a, b, c} with "a", "b", "c" representing three distinct symbols. In this example, assuming that the number of occurrences for element "a" is one (1), the number of occurrences for element "b" is five (5) and the number of occurrences for element "c" is two (2), the probability of occurrence for element "a" may be 1/8, the probability of occurrence for element "b" may be 5/8 and the probability of occurrence for element "c" may be 2/8. In the example, the letters "a," "b" and "c" may be used to represent any three different distinct symbols, not necessarily the letters themselves. It should be noted that each element a, b or c may have a predefined size that may be different in different embodiments because different embodiments may use different codes for the elements. For example, the predefined size for an element may be 7 bits in ASCII, 8 bits in extended ASCII, or 32 bits in UTF-32.

Figure 2A:
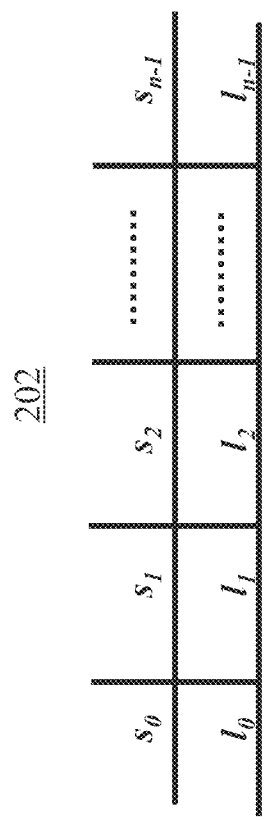
FIG. 2A schematically shows a number of occurrences table in accordance with an embodiment of the present disclosure.

FIG. 2A schematically shows a number of occurrences table 202 in accordance with an embodiment of the present disclosure. The number of occurrences table 202 may be a table of number of occurrences for all elements of the symbol set and may be referred to as the $l_s$ table. For each symbol $s_i$ (with the subscript "i" from 0 to n−1), its number of occurrences is $l_i$ may be stored. It should be noted that the first row of elements is shown in table 202 for illustration. In some embodiments, the position of each number of occurrences in the second row may correspond to the position of the corresponding symbol in the symbol set and thus, the table 202 may only need the second row recording the numbers of occurrences of the symbols. For the example of the alphabet being {a, b, c} with three symbols (n=3) the number of occurrences table may be Table 1 below. In one embodiment, the alphabet {a, b, c} may be stored in a symbols table separately during the encoding operation and the list of number of occurrences {1, 5, 2} may be stored as an alternative to the Table 1 with positions of the number of occurrences corresponding to the positions of symbols in the list of symbols in the alphabet.

TABLE 1

Number of occurrences of symbol set {a, b, c} in the simple example

| a | b | c |
| --- | --- | --- |
| 1 | 5 | 2 |

Figure 2B:
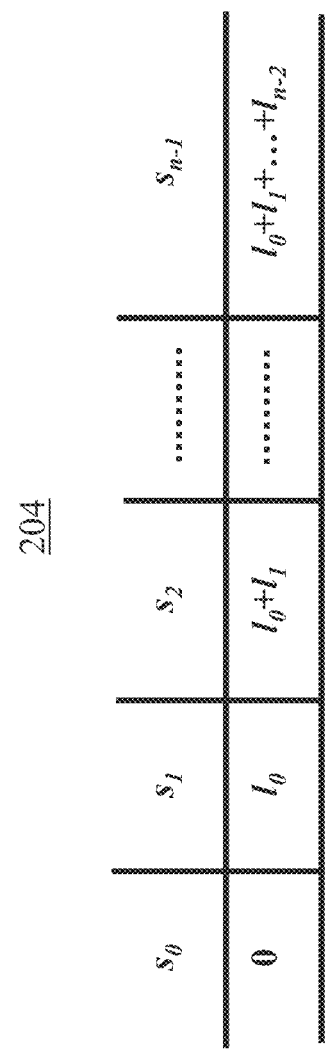
FIG. 2B schematically shows a cumulative number of occurrences table in accordance with an embodiment of the present disclosure.

FIG. 2B schematically shows a cumulative number of occurrences table 204 in accordance with an embodiment of the present disclosure. The cumulative number of occurrences table 204 may be a table of cumulative occurrences for all elements of the symbol set. A cumulative occurrence for an element, which may be referred to as $b_s$, is the sum of occurrences of all elements preceding the element in the alphabet. In other words, the cumulative occurrence for one element is a running total of occurrences for elements before this element in the symbol set. The cumulative number of occurrences table 204 may also be referred to as the $b_s$ table. For symbol $s_0$, there is no element preceding the first element, so the cumulative occurrence for symbol $s_0$ may be zero stored in table 204. For all subsequent symbols $s_i$ (with the subscript "i" from 1 to n−1), their respective cumulative occurrence may be $0+l_0+ \ldots +l_{i-1}$.

It should be noted that the first row of elements is shown in table 204 for illustration. In some embodiments, the position of each cumulative occurrence in the second row may correspond to the position of the corresponding symbol in the symbol set and thus, the table 204 may only need the second row recording the cumulative occurrences for the symbols. For the example of the alphabet being {a, b, c} with three symbols (n=3) the cumulative occurrences table $b_s$ may be Table 2 below. In one embodiment, the alphabet {a, b, c} may be stored separately during the encoding operation and the list of cumulative occurrences {0, 1, 6} may be stored as an alternative to the Table 2 with positions of the cumulative number of occurrences corresponding to the positions of elements in the list of elements in the alphabet.

TABLE 2

Cumulative occurrences of symbol set {a, b, c} in the simple example

| a | b | c |
| --- | --- | --- |
| 0 | 1 | 6 |

In one embodiment, either table 202 or table 204 may have the row of symbols but not both.

Referring back to FIG. 1, at block 106, encoding may be performed based on the number of occurrences and cumulative number of occurrences tables and at block 108, encoded data may be output from a compressor. In one embodiment, the encoding may generate a sequence of numbers with each symbol from the input block of symbols being processed. Each number in the sequence of numbers may represent a state that may be generated based on already processed symbols at that point, and the next number in the sequence may be a function of the current state and the incoming symbol. In some embodiments, the encoding function may be represented as C(x,s), with x being a current state and s being the incoming symbol (e.g., the next symbol to be processed).

It should be noted that a decoding process may work on the encoding generated states in a reversed order. That is, the last encoded symbol may be the first symbol decoded, and the decoding process may start from the last state generated during the compression process 100 and work until the first state generated during the compression process 100. In one embodiment, to get the decoded symbols in the order of input block of symbols, the compression process 100 may start with the last symbol of the input block and work backward until the first symbol of the input block. In another embodiment, the compression process 100 may start with the first symbol of the input block and work forward until the last symbol of the input block, and correspondingly the decoding process may get the last symbol of the input block decoded first and the first symbol of the input block decoded last.

Figure 2C:
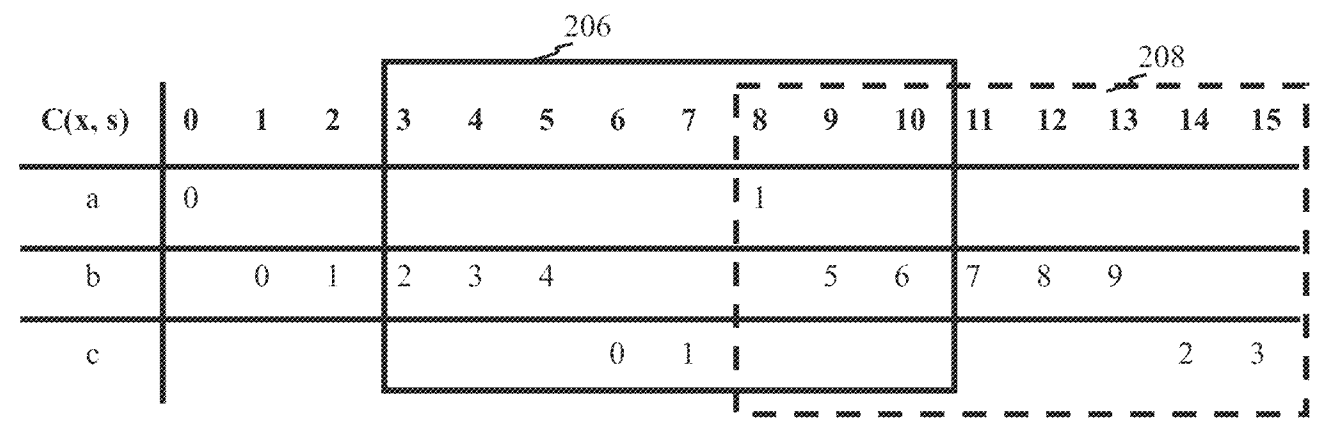

Embodiments according to the present disclosure may need to choose L distinct states for compression. In some embodiments, the L distinct states may be an interval of L different numbers generated during the compression process 100. The interval may be a range for the sequence of numbers. During the compression process 100, when a state generated by the encoding function C(x,s) exceeds the range, some bits of the generated state may be transferred to an output stream (or output buffer) such that the remaining portion of the generated state may fall into the interval. In some embodiments, the generated state may be right shifted to reduce the value of the generated state and the shifted bits may be transferred to the output stream (or output buffer). In various embodiments, the interval for the states may have a span of L, for example, M to M+L−1, in which M may be the base value of the range of states and may be an integer equal to or larger than zero. FIG. 2C schematically shows intervals for the states and symbol state intervals in accordance with an embodiment of the present disclosure. The table shown in FIG. 2C may be an encoding state table for the simple example of {a, b, c} with distribution of {1/8, 5/8, 2/8}. The first row may be states that may be generated during an encoding process. The second row may be numbers of occurrences for encoding symbol "a", the third row may be numbers of occurrences for encoding symbol "b" and the fourth row may be numbers of occurrences for encoding symbol "c". Block 206 may be a selection of 3 to 10 as the L distinct states (e.g., the base value M being 3 for the range of states). In block 206, symbol "a" may have a range of numbers of occurrences of 1 to 1 (e.g., state interval of 1 to 1), symbol "b" may have a range of numbers of occurrences 2 to 4 and 5 to 6 (e.g., state interval of 2 to 6), and symbol "c" may have a range of numbers of occurrences of 0 to 1 (e.g., state interval of 0 to 1).

In at least one embodiment, the range of the states may be chosen as L to 2*L−1 with "L" being the sum of occurrences of all symbols and "*" representing multiplication. In such an embodiment, the base value "M" of the range of the states may be equal to L. Each symbol "s" may also have a symbol state interval $Int_s$ of $1_s$ to $2*1_s-1$. Block 208 may be such a selection with 8 to 15 as the interval for the states (with M being 8 and L also being 8). In block 208, symbol "a" may have a range of numbers of occurrences of 1 to 1 (e.g., state interval of 1 to 1 with $1_s$ being 1), symbol "b" may have a range of numbers of occurrences 5 to 9 (e.g., state interval of 5 to 9 with $1_s$ being 5), and symbol "c" may have a range of numbers of occurrences 2 to 3 (e.g., state interval of 2 to 3 with $1_s$ being 2).

In some embodiments, with M being selected as equal to "L", encoding at block 106 may start with initializing the state "x" to an initial value of "L," then encoding may be performed such that for each symbol in the input data block, based on the number of occurrences table and the cumulative occurrences table, a number of shifts for right-shifting a current state "x" for encoding a current symbol and a next state "x" may be obtained dynamically at runtime. For example, in one embodiment, encoding at block 106 may execute a loop for each symbol of the input block. The loop may work on the symbols from the last symbol to the first symbol of the input block. Inside the loop, the value of "x" may be right shifted until what's left of "x," which may be referred to as $x_{tmp}$, may fall into the symbol state interval for the current symbol. The number of shifts may be referred to as nBits. The next value of state generated by encoding the current symbol "s" may be determined by adding the cumulative occurrence for the current symbol to the $x_{tmp}$ and subtracting the number of occurrences for the current symbol and adding M. That is, the new "x" is equal to $b_s+x_{tmp}-1_s+M$. The nBits of bits being shifted right may be output to the encoded data in block 108.

In one embodiment, the encoding and output operation in block 106 and 108 may be represented in pseudo code as follows, in which "lg( )" is the binary logarithm function, ">>" is the right shift operator, "∈" is the belong to operator:

Initial x=M, R=lg(L);
For the last symbol to the first symbol of the block of symbols to be encoded
    For i=0 to R;
        nBits=i;
        $x_{tmp}$=x>>i;
        until ($x_{tmp}$∈$Int_s$) break;
    end
    New x=$b_s+x_{tmp}-1_s+M$;
    Output least significant nBits bits of x (which may be referred to as x[(nBits−1):0]) to the encoded data
end At the end of the compression process 100, the encoding result may include the encoded data and a final state x. The final state x may be the new state x generated by encoding the last symbol in the input subtracted by M. The encoding result may be output at the block 108.

Block 106 and block 108 may be explained using the simple example symbols set {a, b, c} with "L" being 8, number of occurrences being {1, 5, 2} and cumulative occurrences being {0, 1, 6}. To encode a string "bac", in an embodiment that starts from the last symbol and works until the first symbol, the letter "c" may be encoded first. The initial value "x" may be initialized to 8.

The letter "c" may have cumulative occurrences of 6 and number of occurrences of 2. The symbol state interval for "c" may be 2 to 3 (e.g., 2*2−1). The initial x value 8 may be represented in binary as b1000 so it may need to be right shifted twice for the value $x_{tmp}$ to become b10 (e.g., decimal number 2) to fall into the 2 to 3 interval. The new state "x" may become 6+2−2+8, which may be equal to 14. The right shifted two bits b00 may be put into the encoded data.

With the state "x" now being 14, the next letter "a" may be encoded. The letter "a" may have a cumulative occurrence of 0 and number of occurrences of 1. The symbol state interval for "a" may be 1 to 1 (e.g., 2*1−1). The number 14 may be represented in binary as b1110 so it may need to be right shifted three times for the value $x_{tmp}$ to become b1 to fall into the 1 to 1 interval. The new state "x" may become 0+1−1+8, which may equal to 8. The right shifted three bits b110 may be put into the encoded data.

With the state "x" now being 8, the next letter "b" may be encoded. The letter "b" may have a cumulative occurrence of 1 and number of occurrences of 5. The symbol state interval for "b" may be 5 to 9 (e.g., 2*5−1). The number 8 may be represented in binary as b1000 and it may need no shift (zero shift) for the value $x_{tmp}$ to fall into the 5 to 9 interval. The new state "x" may become 1+8−5+8, which may equal to 12. Because "b" may be a last symbol to be encoded, no bits may be put into the encoded data after encoding "b" and a final state x may be obtained by subtracting L from the last generated new state "x" (e.g., 12−8). Therefore, in one embodiment, the encoding result output from a compressor may be encoded data b11000 and a final state x 4.

It should be noted that there is no restriction for the order in which the right shifted bits may be put into the encoded data. That is, a compressor may be configured to put the righted shifted bits into the encoded data in different orders as long as the order information may be preserved such that a decompressor may obtain this information later for decoding. For example, encoding "a" generated three bits b110 being shifted out and put in the encoded data as b110 or b011, and the order information may be preserved for the decompressor to obtain and use for decoding.

Moreover, sets of bits corresponding to consecutive symbols generated in successive encoding operation loops also may be concatenated in any order as long as the concatenation order information may be preserved such that a decompressor may obtain this concatenation information later for decoding. For example, b00 generated by encoding the first element "c" and b110 generated by encoding the second element "b" may be concatenated by b011+b00 as b01100 or b00+b011 as b00011, and the concatenation order information may be preserved for the decompressor to obtain and use for decoding. It at least one embodiment, the bit order, the concatenation order or both may be predetermined (e.g., specified in a specification) and the compressor and decompressor may follow the predetermined orders and thus, in this embodiment, the bit order, the concatenation order or both may not need to be preserved and passed to the decompressor because the decompressor may correctly decode by using the predetermined orders.

Because the compression process 100 may include a loop with a loop index starting from 0 stepping up one by one to lg(L) for each symbol, an embodiment of the compression process 100 with L reduction (smaller L) may take less time to complete the compression than an embodiment of the compression process 100 without L reduction.

Compressor embodiments according to the present disclosure may be friendly to hardware implementations. The number of occurrences table may need n entries (with n being number of distinct symbols of the alphabet) and the cumulative number of occurrences table may also need n entries. The entry size may be lg(L) bits such that the required storage for these two tables may be 2*n*lg(L), in which may be the multiplication operator and "lg( )" may the binary logarithm function. An embodiment with L reduction may also be more hardware friendly than an embodiment without L reduction, because the tables may take less space with smaller entry size (L smaller thus lg(L) smaller). In embodiments in which the bit length of a symbol may be equal to lg(L), the alphabet may be stored together with either table 202 or 204. In embodiments in which the bit length of a symbol is not equal to lg(L), the alphabet may be stored in a separate list and the tables 202 and 204 may only need the second rows in respective tables. It should be noted that encoding techniques according to the present disclosure do not need any encoding tables that contains a list of generated states with each state accompanied by a corresponding symbol (a previous state encoded with this symbol to generate the state). Therefore, compressor embodiments according to the present disclosure may need little storage space, and may be friendly to be implemented in a Field Programmable Gate Array (FPGA) or an Application Specific Integrated Circuit (ASIC), etc.

Figure 3:
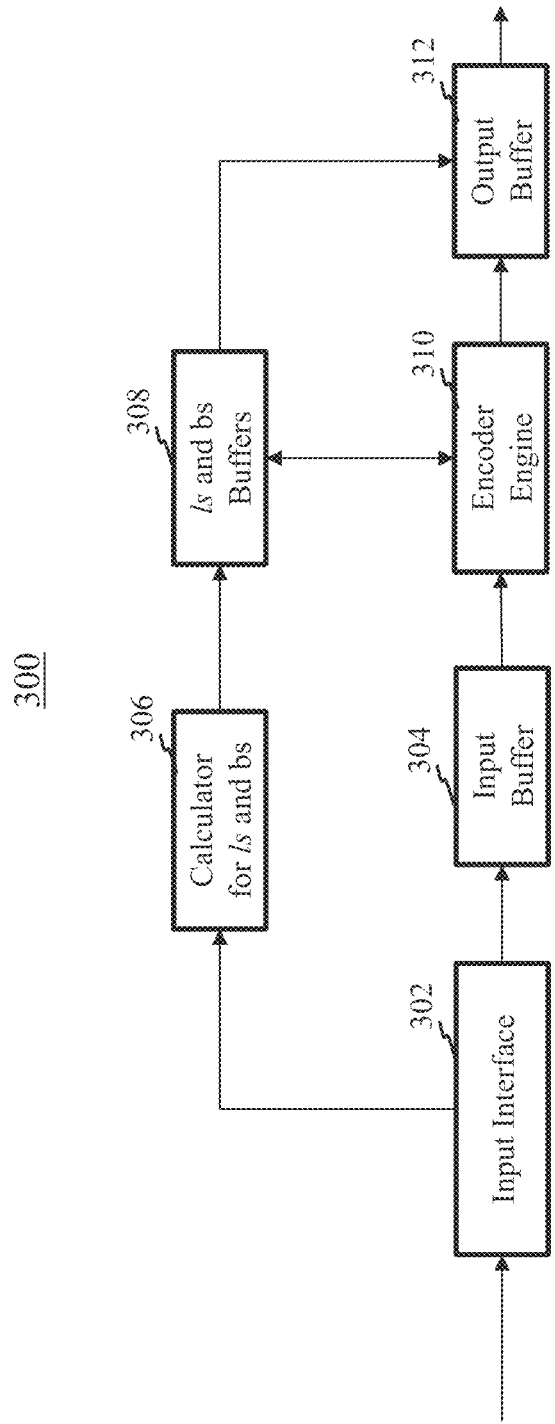
FIG. 3 schematically shows a compressor in accordance with an embodiment of the present disclosure.

FIG. 3 schematically shows a compressor 300 in accordance with an embodiment of the present disclosure. The compressor 300 may be configured to implement the compression process 100. The compressor 300 may comprise an input interface 302, an input buffer 304, a calculator 306, a table buffer 308, an encoder engine 310 and an output buffer 312. The input interface 302 may be coupled to an external bus and configured to perform block 102 to receive data to be encoded. The received data may have one copy stored in the input buffer 304 and another copy sent to the calculator 306. The calculator 306 may be configured to perform block 104 including: scanning the input data to build the alphabet if alphabet is not given, determining the number of occurrences for each symbol in the alphabet and calculating the cumulative occurrences. The table buffer 308 may store the tables generated by the calculator 306, which may include the number of occurrences table 202 and the cumulative occurrences table 204.

In some embodiments, symbols in the alphabet may be represented in an order, for example, extended ASCII code is a list of 256 consecutive numbers that correspond to 256 characters, English characters in lower case are 26 letters from "a" to "z." In such embodiments, the alphabet may be obtained without scanning the input data and there may not be a need to store the alphabet because both encoder and decoder may obtain such information (e.g., the encoding or decoding specification may provide the alphabet) and the address or index of each entry of the table 202 and table 204 may indicate the corresponding symbol. For example, if the alphabet is extended ASCII, the first symbol may be "null" and the first entry in the table 202 may correspond to the number of occurrences for symbol "null" and the first entry in the table 204 may correspond to the cumulative occurrences for symbol "null." In another example, if the alphabet is English letters in lower case, the first symbol may be "a" and the first entry in the table 202 may correspond to the number of occurrences for symbol "a" and the first entry in the table 204 may correspond to the cumulative occurrences for symbol "a."

In some other embodiments, the alphabet may be built by scanning the input data and the distinct symbols in the input data may be unknown before the scan. In such embodiments, the alphabet may be built at runtime and, in one embodiment, it may be stored in a separate table or list in the table buffer 308. In another embodiment, the alphabet may be built at runtime but the list of symbols may be a row in either the table 202 or the table 204 in the table buffer 308 so that there is no need for a separate alphabet table or list.

The encoder engine 310 may be configured to carry out the encoding operation at block 106 using the tables in the table buffer 308 and data in the input buffer 304. The encoded data may be put into the output buffer 312 for the block 108. In some embodiments, the alphabet and number of occurrences may also be put into the output buffer 312. Moreover, in some embodiment, the bit order and concatenation order information for the encoded data may also be output (e.g., to the output stream or into the output buffer).

Figure 4:
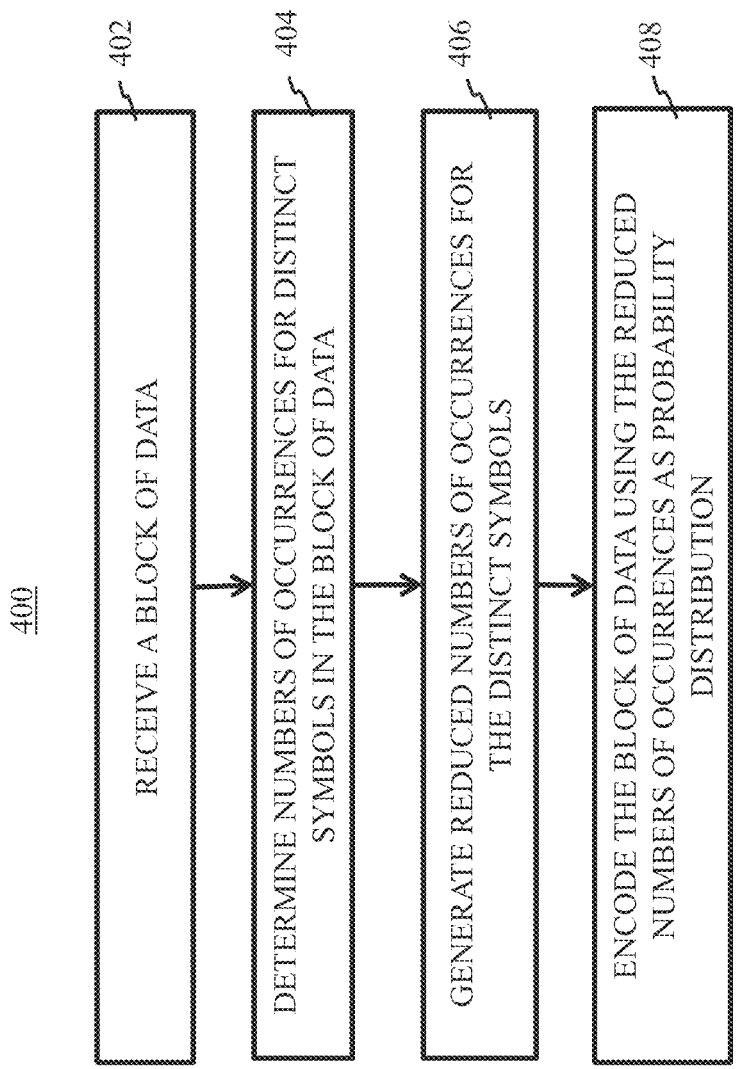
FIG. 4 schematically shows a compression process in accordance with another embodiment of the present disclosure.

FIG. 4 schematically shows a compression process 400 in accordance with another embodiment of the present disclosure. In one or more embodiments, the compression process 400 may also be referred to as an encoding process and the terms and techniques described with respect to the compression process 100 are also applicable in the compression process 400 unless otherwise noted. At block 402, a block of input data may be received. The block 402 may be identical to block 102 of the compression process 100 in various embodiments.

At block 404, numbers of occurrences of distinct symbols in the block of input data may be determined. As described with respect to block 104, in various embodiments, data in the input data block may be represented or organized in symbols, which may be power of 2 bits in some embodiments and not power of 2 bits in some other embodiments, and the total number of all symbols in an input data block may be represented as $S_{total}$. In general, a block of data may be formed by a set of distinct symbols with each symbol occurring once or multiple times. In one embodiment, the input data may be scanned to build the set of distinct symbols, and also to count the number of distinct symbols and how many times each distinct symbol occurs in the block of input data. Therefore, in block 404, "$l_{s\text{-}actual}$" for the set of distinct symbols in the block of input data and "$L_{actual}$" for the block of data may be obtained.

At block 406, reduced numbers of occurrences for the distinct symbols in the input block of data may be generated. In one embodiment, for example, after counting the number of occurrences "$l_{s\text{-}actual}$" for an element, this actual number of occurrences may be reduced to generate a reduced number of occurrences "$l_{s\text{-}reduced}$" by dividing "$l_{s\text{-}actual}$" with a predetermined number DIV and round the division result to a non-zero whole number. There may be different approaches to obtain the non-zero whole number as described with respect to block 104 and they may be implemented in various embodiments for block 406. For example, the non-zero whole number may be obtained by rounding up the division result to the nearest whole number using a ceiling function; rounding down the division result to the nearest whole number using a floor function, and if the result of the floor function is zero, setting the non-zero whole number to one; or rounding the division result to the closest whole number (e.g., rounding up if the reminder is equal to or greater than 0.5 and rounding down if the reminder is less than 0.5), and if the result by rounding is zero, setting the non-zero whole number to one.

After the reduction in each individual number of occurrences for each distinct symbol, the number of total occurrences of all symbols may also be reduced to a reduced number of total occurrences of all symbols, which may be represented as "$L_{reduced}$." It should be noted that $L_{reduced}$ may be close to $L_{actual}$/DIV but not necessarily equal.

At block 408, the block of data may be encoded using the reduced numbers of occurrences as probability distribution. After the reduction for each individual number of occurrences for each distinct symbol, the reduced number of total occurrences of all symbols "$L_{reduced}$" may be obtained and probability of occurrences for each distinct symbol may be "$l_{s\text{-}reduced}/L_{reduced}$". And any entropy encoding scheme based on the probability distribution may be used to perform the encoding.

In some embodiments, at block 408, encoding tables may be built using the reduced numbers of occurrences of the distinct symbol and encoding using these tables may be performed. In one embodiment, for example, tables 202 and 204 may be built using the reduced number of occurrences of the distinct symbols and the encoding techniques for the compression process 100 (e.g., implementations for blocks 104, 106 and 108) may be used.

In some other embodiments, any conventional Asymmetric Numeral Systems (ANS) encoding approach may be used at block 408 for encoding, including but not limited to, stream ANS coding, table ANS, range ANS, etc. In one embodiment, for example, three ANS tables may be built: a start table, a number of bits table and an encoding states table may be built and used for encoding. The start table may be represented as start[s] and the number of bits table may be represented as nb[s], with the index "s" being the elements in the alphabet. Each entry in the start table may be obtained by start[s]=−$l_{s\text{-}reduced}$+sum(all $l_{s'\text{-}reduced}$) with s'<s (s' may represent an element in the alphabet that may be positioned before the element "s"). Each entry in the number of bits table may be obtained by nb[s]=(k[s]<<r)−($l_{s\text{-}reduced}$<<k[s]), in which "<<" being the left shift operator, k[s]=R−floor(lg($l_{s\text{-}reduced}$)), R being lg($L_{reduced}$), r being R+1. It should be noted that because R is obtained by lg($L_{reduced}$), this particular embodiment may need $L_{reduced}$ to be power of 2. The encoding states table may be represented as EncodingTable[i] with the index "i" from 0 to $L_{reduced}$−1. To fill the encoding states table, the initial value for the state X may be set to zero, and an iteration step may be set to 5/8*$L_{reduced}$+3, in which "*" may be a multiplication operator. A loop with the index "i" from 0 to $L_{reduced}$−1 may be used to fill the entries of the encoding states table. Inside the loop, EncodingTable[i] may be set to the current state X and the next state X may be set to mod(X+step, $L_{reduced}$), in which mod( ) is the modulo function.

In this embodiment, once the ANS tables may be completed, encoding may be performed using the ANS tables. The number of bits to be generated for a current element "s" may be nbBits=(x+nb[s])>>r, in which "x" may be a current state and ">>" may be a right shift operator. A temporary state $x_{tmp}$ may be set to the current state right shift nbBits times. And the new state x may be set to EncodingTable[start[s]+$x_{tmp}$]+L and nbBits bits of the current state x (e.g., x[nbBits−1:0]) may be output to the encoded data (e.g., output stream or output buffer).

In one embodiment, ANS tables may be generated by pseudo code as follows, in which R is lg($L_{reduced}$), r=R+1, "<<" is the left shift operator, ">>" is the right shift operator, "*" is the multiplication operator, mod( ) is the modulo function:

For each element "s"
    start[s]=−$l_{s\text{-}reduced}$+sum(all $l_{s'\text{-}reduced}$) where s'<s;
    k[s]=R−floor(lg($l_{s\text{-}reduced}$));
    nb[s]=(k[s]<<r)−($l_{s\text{-}reduced}$<<k[s]);
    end
    X=0; step=5/8*$L_{reduced}$+3;
    for i=0 to $L_{reduced}$−1
    EncodingTable[i]=X;
    X=mod(X+step, $L_{reduced}$);
    end The encoding process using the ANS tables may be represented by pseudo code as follows:

Initial x=$L_{reduced}$, R=lg($L_{reduced}$);
    For the last symbol to the first symbol of the block of symbols to be encoded
    nbBits=(x+nb[s])>>r;
    $x_{tmp}$=x>>nbBits;
    New x=EncodingTable[start[s]+$x_{tmp}$]+$L_{reduced}$;
    Output least significant nBits bits of x (which may be referred to as x[(nBits−1):0]) to the encoded data
    end The present disclosure provides systems and methods for a lossless compression using entropy encoding. In an exemplary embodiment, there is provided a method that may comprise receiving an input data block to be compressed, generating a number of occurrences table and a cumulative occurrences table for symbols in the input data block, for each symbol in the input data block, based on the number of occurrences table and the cumulative occurrences table, dynamically obtaining a number of shifts for right-shifting a current state "x" to encode a current symbol, outputting right-shifted bits to encoded data and obtaining a next state "x" and obtaining a final state "X" from a last state "x" generated in a final loop.

The compression process 400 may be implemented by an embodiment of the compressor 300 in which the table buffer 308 may be optional. Because some embodiments may perform the compression using encoding tables (e.g., tables 202 and 204, or ANS tables) and some other embodiments may perform the compression without using encoding tables (e.g., stream ANS coding).

In one exemplary embodiment, there is provided a method that may comprise receiving an input data block to be compressed, determining numbers of occurrences for distinct symbols in the input data block, generating reduced numbers of occurrences for the distinct symbols based on the numbers of occurrences for the distinct symbols and encoding the input data block using the reduced numbers of occurrences as probability distribution of the distinct symbols in the input data block.

In one embodiment, encoding the input data block using the reduced number of occurrences may comprises: building a number of occurrences table and a cumulative occurrences table using the reduced numbers of occurrences for the distinct symbols; for each symbol in the input data block, based on the number of occurrences table and the cumulative occurrences table, dynamically obtaining a number of shifts for right-shifting a current state "x" to encode a current symbol, outputting right-shifted bits to encoded data and obtaining a next state "x"; and obtaining a final state "X" from a last state "x" generated in a final loop.

In one embodiment, the method may further comprise initializing an initial state "x" to a number $L_{reduced}$ with $L_{reduced}$ being a sum of all reduced numbers of occurrences in the number of occurrences table. The final state "X" may be obtained from the last state "x" by the last state "X" Subtracting $L_{reduced}$.

In one embodiment, dynamically obtaining the number of shifts and obtaining the next state "x" may comprise: right shifting a value of the state "x" a number of shifts until a right-shifted value of the state "x" falls into a symbol state interval for a current symbol, recording the number of shifts as nBits, obtaining a reduced number of cumulative occurrences for the current symbol from the cumulative occurrences table, obtaining a reduced number of occurrences for the current symbol from the number of occurrences table and obtaining a next value of the state "x" by adding the reduced cumulative occurrences for the current symbol to the right-shifted value of the state "x" and subtracting the reduced number of occurrences for the current symbol and adding $L_{reduced}$, in which $L_{reduced}$ may be a sum of all reduced numbers of occurrences for all distinct symbols in the input data block.

In one embodiment, the reduced numbers of occurrences for the distinct symbols may be generated by dividing each of the numbers of occurrences by a predetermined number and rounding division results to non-zero whole numbers.

In one embodiment, rounding the division results to the non-zero whole numbers may be performed using a ceiling function on each division result.

In one embodiment, rounding the division results to the non-zero whole numbers may be performed by using a floor function on each division result, and if a result of the floor function is zero, setting a corresponding non-zero whole number to one.

In one embodiment, rounding the division results to the non-zero whole numbers may be performed by rounding each division result to a closest whole number, and if a result by rounding to the closest whole number is zero, setting a corresponding non-zero whole number to one.

In one embodiment, encoding the input data block using the reduced number of occurrences may comprises building a start table, a number of bits table and an encoding states table using the reduced numbers of occurrences; and encoding the input data block using the start table, the number of bits table and encoding states table.

In one embodiment, each entry in the start table may be obtained by start[s]=$l_{s\text{-}reduced}$+sum(all $l_{s'\text{-}reduced}$) with s'<s ($l_{s\text{-}reduced}$ being a reduced number of occurrences for a distinct symbol "s" and s' being a distinct symbol in a set of the distinct symbols positioned before "s"); each entry in the number of bits table may be obtained by nb[s]=(k[s]<<r)−($l_{s\text{-}reduced}$<<k[s]), in which "<<" being the left shift operator, k[s] being R−floor(lg($l_{s\text{-}reduced}$)), R being lg($L_{reduced}$), r being R+1, $L_{reduced}$ being a sum of all reduced numbers of occurrences, floor( ) being a floor function and lg( ) being a binary logarithm function; and the encoding states table may be obtained by initializing a state X to zero and an iteration step to 5/8*$L_{reduced}$+3, and then executing a loop with a loop index "i" from 0 to $L_{reduced}$−1 and each entry of the encoding states table EncodingTable[i] being set to a current state X and obtaining a next state X as mod(X+step, $L_{reduced}$), in which "*" may be a multiplication and mod( ) may be a modulo function.

In another exemplary embodiment, there is provided a compressor that may comprise: an input interface configured to receive an input data block to be compressed, an input buffer coupled to the input interface to store the received input data block to be compressed, a calculator coupled to the input interface and configured to determine numbers of occurrences for distinct symbols in the input data block and generate reduced numbers of occurrences for the distinct symbols based on the numbers of occurrences for the distinct symbols, and an encoder engine configured to encode the input data block using the reduced numbers of occurrences as probability distribution of the distinct symbols in the input data block.

In one embodiment, to encode the input data block using the reduced number of occurrences may comprise: building a number of occurrences table and a cumulative occurrences table using the reduced numbers of occurrences for the distinct symbols; for each symbol in the input data block, based on the number of occurrences table and the cumulative occurrences table, dynamically obtaining a number of shifts for right-shifting a current state "x" to encode a current symbol, outputting right-shifted bits to encoded data and obtaining a next state "x"; and obtaining a final state "X" from a last state "x" generated in a final loop.

In one embodiment, the encoder engine may be further configured to initialize an initial state "x" to a number $L_{reduced}$ with $L_{reduced}$ being a sum of all reduced numbers of occurrences in the number of occurrences table. The final state "X" may be obtained from the last state "x" by the last state "x" subtracting $L_{reduced}$.

In one embodiment, to dynamically obtain the number of shifts and obtain the next state "x", the encoder engine may be further configured to: right shift a value of the state "x" a number of shifts until a right-shifted value of the state "x" falls into a symbol state interval for a current symbol, record the number of shifts as nBits, obtain reduced cumulative occurrences for the current symbol from the cumulative occurrences table, obtain a reduced number of occurrences for the current symbol from the number of occurrences table, and obtain a next value of the state "x" by adding the reduced cumulative occurrences for the current symbol to the right-shifted value of the state "x" and subtracting the reduced number of occurrences for the current symbol and adding $L_{reduced}$, in which $L_{reduced}$ may be a sum of all reduced numbers of occurrences for all distinct symbols in the input data block.

In one embodiment, the reduced numbers of occurrences for the distinct symbols may be generated by dividing each of the numbers of occurrences by a predetermined number and rounding division results to non-zero whole numbers.

In one embodiment, rounding the division results to the non-zero whole numbers may be performed using a ceiling function on each division result.

In one embodiment, rounding the division results to the non-zero whole numbers may be performed by using a floor function on each division result, and if a result of the floor function is zero, setting a corresponding non-zero whole number to one.

In one embodiment, rounding the division results to the non-zero whole numbers may be performed by rounding each division result to a closest whole number, and if a result by rounding to the closest whole number is zero, setting a corresponding non-zero whole number to one.

In one embodiment, to encode the input data block using the reduced number of occurrences, the encoder engine may be further configured to: build a start table, a number of bits table and an encoding states table using the reduced numbers of occurrences; and encode the input data block using the start table, the number of bits table and encoding states table.

In one embodiment, each entry in the start table may be obtained by start[s]=$l_{s\text{-}reduced}$+sum(all $l_{s'\text{-}reduced}$) with s'<s ($l_{s\text{-}reduced}$ being a reduced number of occurrences for a distinct symbol "s" and s' being a distinct symbol in a set of the distinct symbols positioned before "s"); each entry in the number of bits table may be obtained by nb[s]=(k[s]<<r)−($l_{s\text{-}reduced}$<<k[s]), in which "<<" being the left shift operator, k[s] being R−floor(lg($l_{s\text{-}reduced}$)), R being lg($L_{reduced}$), r being R+1, $L_{reduced}$ being a sum of all reduced numbers of occurrences, floor( ) being a floor function and lg( ) being a binary logarithm function; and the encoding states table may be obtained by initializing a state X to zero and an iteration step to 5/8*$L_{reduced}$+3, and then executing a loop with a loop index "i" from 0 to $L_{reduced}$−1 and each entry of the encoding states table EncodingTable[i] being set to a current state X and obtaining a next state X as mod(X+step, $L_{reduced}$), in which "*" may be a multiplication and mod( ) may be a modulo function.

Any of the disclosed methods and operations may be implemented as computer-executable instructions (e.g., software code for the operations described herein) stored on one or more computer-readable storage media (e.g., non-transitory computer-readable media, such as one or more optical media discs, volatile memory components (such as Dynamic Random Access Memory (DRAM) or Static Random Access Memory (SRAM)), or nonvolatile memory components (such as hard drives)) and executed on a device controller (e.g., firmware executed by ASIC). Any of the computer-executable instructions for implementing the disclosed techniques as well as any data created and used during implementation of the disclosed embodiments can be stored on one or more computer-readable media (e.g., non-transitory computer-readable media).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
  receiving an input data block to be compressed;
  determining numbers of occurrences for distinct symbols in the input data block;
  generating reduced numbers of occurrences for the distinct symbols based on the numbers of occurrences for the distinct symbols; and
  encoding the input data block using the reduced numbers of occurrences as probability distribution of the distinct symbols in the input data block.

2. The method of claim 1, wherein encoding the input data block using the reduced number of occurrences comprises:
  building a number of occurrences table and a cumulative occurrences table using the reduced numbers of occurrences for the distinct symbols;
  for each symbol in the input data block, based on the number of occurrences table and the cumulative occurrences table, dynamically obtaining a number of shifts for right-shifting a current state "x" to encode a current symbol, outputting right-shifted bits to encoded data and obtaining a next state "x"; and
  obtaining a final state "X" from a last state "x" generated in a final loop.

3. The method of claim 2, further comprising initializing an initial state "x" to a number $L_{reduced}$ with $L_{reduced}$ being a sum of all reduced numbers of occurrences in the number of occurrences table, wherein the final state "X" is obtained from the last state "x" by the last state "x" subtracting $L_{reduced}$.

4. The method of claim 2, wherein dynamically obtaining the number of shifts and obtaining the next state "x", comprises:
  right shifting a value of the state "x" a number of shifts until a right-shifted value of the state "x" falls into a symbol state interval for a current symbol;
  recording the number of shifts as nBits;
  obtaining a reduced number of cumulative occurrences for the current symbol from the cumulative occurrences table;
  obtaining a reduced number of occurrences for the current symbol from the number of occurrences table; and
  obtaining a next value of the state "x" by adding the reduced cumulative occurrences for the current symbol to the right-shifted value of the state "x" and subtracting the reduced number of occurrences for the current symbol and adding $L_{reduced}$, with $L_{reduced}$ being a sum of all reduced numbers of occurrences for all distinct symbols in the input data block.

5. The method of claim 1, wherein the reduced numbers of occurrences for the distinct symbols are generated by dividing each of the numbers of occurrences by a predetermined number and rounding division results to non-zero whole numbers.

6. The method of claim 5, wherein rounding the division results to the non-zero whole numbers is performed using a ceiling function on each division result.

7. The method of claim 5, wherein rounding the division results to the non-zero whole numbers is performed by using a floor function on each division result, and if a result of the floor function is zero, setting a corresponding non-zero whole number to one.

8. The method of claim 5, wherein rounding the division results to the non-zero whole numbers is performed by rounding each division result to a closest whole number, and if a result by rounding to the closest whole number is zero, setting a corresponding non-zero whole number to one.

9. The method of claim 1, wherein encoding the input data block using the reduced number of occurrences comprises:
  building a start table, a number of bits table and an encoding states table using the reduced numbers of occurrences; and
  encoding the input data block using the start table, the number of bits table and encoding states table.

10. The method of claim 9, wherein each entry in the start table is obtained by start[s]=−$l_{s\text{-}reduced}$+sum(all $l_{s'\text{-}reduced}$) with s'<s ($l_{s\text{-}reduced}$ being a reduced number of occurrences for a distinct symbol "s" and s' being a distinct symbol in a set of the distinct symbols positioned before "s"); each entry in the number of bits table is obtained by nb[s]=(k[s]<<r)−($l_{s\text{-}reduced}$<<k[s]), in which "<<" being the left shift operator, k[s] being R−floor(lg($l_{s\text{-}reduced}$)), R being lg($L_{reduced}$), r being R+1, $L_{reduced}$ being a sum of all reduced numbers of occurrences, floor( ) being a floor function and lg( ) being a binary logarithm function; and the encoding states table is obtained by initializing a state X to zero and an iteration step to 5/8*$L_{reduced}$+3, and then executing a loop with a loop index "i" from 0 to $L_{reduced}$−1 and each entry of the encoding states table EncodingTable[i] being set to a current state X and obtaining a next state X as mod(X+step, $L_{reduced}$), in which "*" is a multiplication and mod( ) is a modulo function.

11. A compressor, comprising:
an input interface configured to receive an input data block to be compressed;
an input buffer coupled to the input interface to store the received input data block to be compressed;
a calculator coupled to the input interface and configured to: determine numbers of occurrences for distinct symbols in the input data block, and generate reduced numbers of occurrences for the distinct symbols based on the numbers of occurrences for the distinct symbols; and
an encoder engine configured to encode the input data block using the reduced numbers of occurrences as probability distribution of the distinct symbols in the input data block.

12. The compressor of claim 11, wherein to encode the input data block using the reduced number of occurrences comprises:
building a number of occurrences table and a cumulative occurrences table using the reduced numbers of occurrences for the distinct symbols;
for each symbol in the input data block, based on the number of occurrences table and the cumulative occurrences table, dynamically obtaining a number of shifts for right-shifting a current state "x" to encode a current symbol, outputting right-shifted bits to encoded data and obtaining a next state "x"; and
obtaining a final state "X" from a last state "x" generated in a final loop.

13. The compressor of claim 12, wherein the encoder engine is further configured to initialize an initial state "x" to a number $L_{reduced}$ with $L_{reduced}$ being a sum of all reduced numbers of occurrences in the number of occurrences table, wherein the final state "X" is obtained from the last state "x" by the last state "x" subtracting $L_{reduced}$.

14. The compressor of claim 12, wherein to dynamically obtain the number of shifts and obtain the next state "x", the encoder engine is further configured to:
right shift a value of the state "x" a number of shifts until a right-shifted value of the state "x" falls into a symbol state interval for a current symbol;
record the number of shifts as nBits;
obtain reduced cumulative occurrences for the current symbol from the cumulative occurrences table;
obtain a reduced number of occurrences for the current symbol from the number of occurrences table; and
obtain a next value of the state "x" by adding the reduced cumulative occurrences for the current symbol to the right-shifted value of the state "x" and subtracting the reduced number of occurrences for the current symbol and adding $L_{reduced}$, with $L_{reduced}$ being a sum of all reduced numbers of occurrences for all distinct symbols in the input data block.

15. The compressor of claim 11, wherein the reduced numbers of occurrences for the distinct symbols are generated by dividing each of the numbers of occurrences by a predetermined number and rounding division results to non-zero whole numbers.

16. The compressor of claim 15, wherein rounding the division results to the non-zero whole numbers is performed using a ceiling function on each division result.

17. The compressor of claim 15, wherein rounding the division results to the non-zero whole numbers is performed by using a floor function on each division result, and if a result of the floor function is zero, setting a corresponding non-zero whole number to one.

18. The compressor of claim 15, wherein rounding the division results to the non-zero whole numbers is performed by rounding each division result to a closest whole number, and if a result by rounding to the closest whole number is zero, setting a corresponding non-zero whole number to one.

19. The compressor of claim 11, wherein to encode the input data block using the reduced number of occurrences, the encoder engine is further configured to:
build a start table, a number of bits table and an encoding states table using the reduced numbers of occurrences; and
encode the input data block using the start table, the number of bits table and encoding states table.

20. The compressor of claim 19, wherein each entry in the start table is obtained by start[s]=−$l_{s\text{-}reduced}$+sum(all $l_{s'\text{-}reduced}$) with s'<s (induced being a reduced number of occurrences for a distinct symbol "s" and s' being a distinct symbol in a set of the distinct symbols positioned before "s"); each entry in the number of bits table is obtained by nb[s]=(k[s]<<r)−($l_{s\text{-}reduced}$<<k[s]), in which "<<" being the left shift operator, k[s] being R−floor(lg($l_{s\text{-}reduced}$)), R being lg($L_{reduced}$), r being R+1, $L_{reduced}$ being a sum of all reduced numbers of occurrences, floor( ) being a floor function and lg( ) being a binary logarithm function; and the encoding states table is obtained by initializing a state X to zero and an iteration step to 5/8*$L_{reduced}$+3, and then executing a loop with a loop index "i" from 0 to $L_{reduced}$−1 and each entry of the encoding states table EncodingTable[i] being set to a current state X and obtaining a next state X as mod(X+step, $L_{reduced}$), in which "*" is a multiplication and mod( ) is a modulo function.

* * * * *